United States Patent [19]

Takemura et al.

[11] Patent Number: 5,612,170
[45] Date of Patent: Mar. 18, 1997

[54] POSITIVE RESIST COMPOSITION

[75] Inventors: Katsuya Takemura; Junji Tsuchiya; Toshinobu Ishihara, all of Nakakubiki-gun; Akinobu Tanaka, Fujisawa; Yoshio Kawai; Jiro Nakamura, both of Isehara, all of Japan

[73] Assignees: Shin-Etsu Chemical Co., Ltd.; Nippon Telegraph and Telephone Company, both of Tokyo, Japan

[21] Appl. No.: 569,659

[22] Filed: Dec. 8, 1995

[30] Foreign Application Priority Data

Dec. 9, 1994 [JP] Japan .................... 6-331720
Dec. 9, 1994 [JP] Japan .................... 6-331721
Dec. 9, 1994 [JP] Japan .................... 6-331722

[51] Int. Cl.$^6$ ........................................ G03C 1/73
[52] U.S. Cl. ............... 430/270.1; 430/326; 430/914; 430/921
[58] Field of Search ............... 430/270.1, 326, 430/914, 921

[56] References Cited

U.S. PATENT DOCUMENTS 5,318,876  6/1994  Schwalm et al. ............ 430/270.1

FOREIGN PATENT DOCUMENTS 520265   6/1992  European Pat. Off. .
4-107460 4/1992  Japan .
6-118651 4/1994  Japan .
6-093045 4/1994  Japan .

OTHER PUBLICATIONS

Abstract of JP 6-118651, Tanaka et al. (Apr. 1994).
Abstract of EP 520,265, Binder et al. (Jun. 1992).

*Primary Examiner*—John A. McPherson
*Attorney, Agent, or Firm*—Millen, White, Zelano, & Branigan, P.C.

[57] ABSTRACT

A positive resist composition based on a silicone polymer contains a photo acid generator which will decompose to generate an acid upon exposure to radiation. The silicone polymer includes hydroxybenzyl units wherein some OH groups are replaced by t-butoxycarbonyl, t-butoxycarbonylmethyl, trimethylsilyl or tetrahydropyranyl groups. In a first form, the photo acid generator is a specific onium salt having at least one phenyl group with a t-alkoxy, t-butoxycarbonyloxy or t-butoxycarbonylmethoxy substituent. In a second form, the composition further contains a nitrogenous compound. In a third form, the composition further contains a dissolution inhibitor in the form of a specific silicone compound. The composition is sensitive to high energy radiation and has high sensitivity and resolution.

23 Claims, No Drawings

POSITIVE RESIST COMPOSITION

BACKGROUND OF THE INVENTION

1. Field of the Invention

This invention relates to a positive resist composition which is highly sensitive to high energy radiation such as deep-ultraviolet line, electron beam and X-ray, can be developed with alkaline aqueous solution to form a pattern, and is thus suitable for use in a fine patterning technique.

2. Prior Art

To comply with the LSI technology tending toward higher integration and higher speed, there were recently developed new resist materials which undergo acid-catalyzed chemical amplification. See Liu et al., J. Vac. Sci. Technol., Vol. B6, 379 (1988). Because of many advantages including a sensitivity at least comparable to conventional high-sensitivity resist materials, high resolution, and high dry etching resistance, the chemically amplified resist materials are regarded promising for deep-ultraviolet lithography. As to negative resists, a three-component chemically amplified resist material comprising a novolak resin, a melamine compound and a photo acid generator is commercially available from Shipley Co. under the trade name of SAL601ER7. At to positive resists, however, there have been commercially available no positive resist materials of the chemical amplification system. In the manufacture of LSIs, interconnection and gate formation can be managed using negative resists whereas the use of negative resists for contact hole formation obstructs fine processing due to fogging. There is a strong demand for high performance positive resist material.

In the past, Ito et al. developed a chemically amplified positive resist by adding an onium salt to a polyhydroxystyrene resin whose hydroxyl group is protected with a t-butoxycarbonyl (t-BOC) group, which is known as PBOCST. See Polymers in Electronics, ACS symposium Series No. 242, American Chemical Society, Washington D.C., 1984, page 11. Since the onium salt used therein contains antimony as a metal component, the PBOCST resist is not desirable from the standpoint of preventing contamination to the substrate.

Ueno et al. reported a deep-UV, chemically amplified positive resist based on poly(p-styreneoxytetrahydropyranyl) as having high sensitivity and high resolution. See No. 36 Applied Physics Society Related Joint Meeting, 1989, 1p-k-7. However, it was difficult to form a fine, high aspect ratio pattern at a high precision because of the mechanical strength thereof.

Many other reports have been made about such chemically amplified positive resist materials using novolak resins and polyhydroxystyrene as a base resin and being sensitive to deep-UV line, electron beam, and X-ray. All of them are single-layer resists. There still remain unsolved problems associated with substrate steps, standing wave resulting from optical reflection at the substrate, and difficulty to form high-aspect ratio patterns. These resist materials are unacceptable in practice.

The two-layer resist technique is recommended in order to form high-aspect ratio patterns on stepped substrates. To enable alkali development in the two-layer resist technique, silicone polymers having a hydrophilic group such as hydroxyl and carboxyl groups are required. Since the silicones having a hydroxyl group directly attached thereto, however, undergo crosslinking reaction in the presence of acid, it is difficult to apply such silanols to chemically amplified positive resist materials. While polyhydroxy-benzylsilsesquioxane is known as a stable alkali soluble silicone polymer, its derivatives obtained by protecting some hydroxyl groups with t-BOC form chemically amplified silicone system positive resist materials when combined with photo acid generators as disclosed in Japanese Patent Application Kokai (JP-A) No. 118651/1994 and SPIE, Vol. 19, 25 (1993), 377. However, silicone polymers are inadequate for fine patterning since they are less compatible with photo acid generators.

The above-mentioned resist materials also suffer from the problem of post-exposure delay (PED) inherently associated with chemically amplified positive resists. The PED problem is that after exposure, impurities such as amines and water in air diffuse into the resist film from its surface to create a distribution of impurities in the film. Because of the likelihood of acid being deactivated by such impurities at the surface, the pattern tends to have a "T-top" profile. There are available no silicone system positive resists which have solved the T-top problem associated with PED. There is a demand for a silicone system positive resist having high sensitivity and resolution.

SUMMARY OF THE INVENTION

Therefore, an object of the present invention is to provide a chemically amplified, silicone based, positive resist composition suitable as a two-layer resist material and having high sensitivity, high resolution and improved processability.

In a first aspect, the invention provides a positive resist composition comprising a silicone polymer, a photo acid generator which will decompose to generate an acid upon exposure to radiation, and optionally a dissolution inhibitor, the composition being developable with alkaline aqueous solution. The silicone polymer is of the general formula (1):

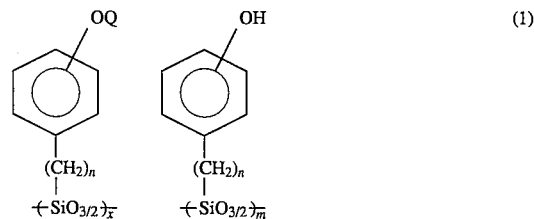

wherein Q is selected from the group consisting of t-butoxycarbonyl, t-butoxycarbonylmethyl, trimethylsilyl and tetrahydropyranyl groups, letter n is an integer of 1 to 3, x and m are numbers satisfying x+m=1, and x is not equal to 0. The photo acid generator is an onium salt of the general formula (2):

wherein R is a substituted or unsubstituted aromatic group, at least one of the R groups is a phenyl group having a t-alkoxy substituent represented by R'$_3$CO— wherein R' is a substituted or unsubstituted monovalent hydrocarbon group having 1 to 10 carbon atoms, a t-butoxycarbonyloxy substituent or a t-butoxycarbonylmethoxy substituent, J is sulfonium or iodonium, M is a p-toluenesulfonate or trifluoromethanesulfonate group, and letter p is equal to 2 or 3.

There are known many onium salts of trifluoromethanesulfonate and toluenesulfonate. Typical are salts of the following formulae (a) to (f).

$(C_6H_5SC_6H_4)(C_6H_5)_2S^+{}^-O_3SCF_3$     (c)

$(C_6H_5)_2I^+{}^-O_3S\phi CH_3$     (d)

$(t\text{-Butyl-}C_6H_4)_2I^+{}^-O_3SCF_3$     (e)

$(C_6H_5)(MeOC_6H_5)I^+{}^-O_3S\phi CH_3$     (f)

Note that $\phi$ is $C_6H_4$.

However, resist materials containing these photo acid generators are less useful since the generators have any one of the following drawbacks. First, some onium salt photo acid generators are less soluble in solvents suitable for coating of resist materials, for example, ethylcellosolve acetate, ethyl lactate and ethoxy-2-propanol. It is then difficult to mix an appropriate amount of the photo acid generator in a resist material. Some other onium salt photo acid generators are soluble in solvents, but more or less incompatible with silicone polymers. It is then difficult to form acceptable resist films. Such resist films are prone to changes with time of sensitivity and a pattern shape during a period from light exposure to heat treatment. Especially in the case of incompatible photo acid generators, the resist film can have a distribution profile of photo acid generator, resulting in overhangs at the pattern surface. Such a phenomenon often occur in chemically amplified resist materials since the acid is deactivated at the resist film surface or the surface is depleted of the photo acid generator.

Moreover, the trifluoromethanesulfonate onium salts (c) and (e) are effective, but give rise to the problem that patterns are negative profile in cross sectional shape. Inversely, the toluenesulfonate onium salt (f) leads to forward tapered patterns. When a mixture of trifluoromethanephosphate and toluenesulfonate onium salts is used, there is obtained a pattern having a wall perpendicular to the substrate. No satisfactory patterns are obtained unless such a mixture of two onium salts having different characteristics is used. See JP-A 118651/1994.

Making investigations on photo acid generators, we have found that a chemically amplified positive resist composition comprising a silicone polymer and a photo acid generator is improved to eliminate the drawbacks of conventional silicone based resist compositions when onium salts of formula (2) are used as the photo acid generator. The onium salts of formula (2) are not only well compatible with silicone polymers, but also well soluble after exposure, leading to formation of a pattern having a wall perpendicular to the substrate. Those onium salts of formula (2) wherein at least one of the R groups is a t-alkoxyphenyl or t-butoxycarbonyloxyphenyl group lead to an improvement in solubility since a phenolic hydroxyl group is generated upon exposure or heat treatment. Also those onium salts of formula (2) wherein at least one of the R groups is a t-butoxycarbonylmethoxyphenyl group lead to an improvement in solubility since a carboxylic acid is generated upon exposure or heat treatment. While most onium salts generally act to inhibit dissolution, the onium salts of the invention act to promote dissolution after exposure. Then due to an increased difference in dissolution rate before and after exposure, the onium salts of the invention used alone rather than in admixture are able to form fine patterns with high precision.

In a second aspect, the invention provides a positive resist composition developable with alkaline aqueous solution, comprising a silicone polymer of formula (1) defined above, a photo acid generator which will decompose to generate an acid upon exposure to radiation, and optionally a dissolution inhibitor. The composition further contains a nitrogenous compound.

More particularly, addition of a nitrogenous compound solves the problem of post-exposure delay (PED) of chemically amplified positive resists. The PED problem arises because after exposure, impurities such as amines and water in air diffuse into the resist film from its surface to create a distribution of impurities in the film. Because of the likelihood of acid being deactivated by such impurities at the surface, the pattern tends to have a "T-top" profile. The addition of a nitrogenous compound to the resist material renders the resist material less sensitive to impurities and reduces the diffusion rate of acid. Thus the addition of a nitrogenous compound is effective for pattern dimension control.

In a third aspect, the invention provides a positive resist composition developable with alkaline aqueous solution, comprising a silicone polymer of formula (1) defined above, a photo acid generator which will decompose to generate an acid upon exposure to radiation, and a dissolution inhibitor. The dissolution inhibitor is a silicone compound of the following general formula (3), (4) or (5):

(3)

(4)

(5)

wherein $R^1$ is a methyl or phenyl group, $R^2$ is a carboxyethyl or p-hydroxyphenylalkyl group, X is a trimethylsilyl, triphenylsilyl or $-SiR^1{}_2R^2$ wherein $R^1$ and $R^2$ are as defined above, letter a is an integer of 0 to 50, b is an integer of 1 to 50, and c is an integer of 3 to 10, the carboxyl or hydroxyl group of said silicone compound being protected with a t-butyl or t-butoxycarbonylmethyl group.

Two-component resist compositions comprising a silicone polymer of formula (1) defined above and a photo acid generator which will decompose to generate an acid upon exposure to radiation are improved in resolution, but have the problem that many alkali soluble groups must be protected in unexposed area of the resist in order to render the unexposed area insoluble in the developer while many protective groups must be decomposed in exposed portions of the resist in order to render the exposed portions soluble in the developer, leaving an increased possibility of inviting thickness changes of the resist film and creating stresses or bubbles in the film. Then chemically amplified resist compositions of the three-component system wherein functions are more diversified, that is, compositions comprising a base polymer, a dissolution inhibitor and a photo acid generator would be more advantageous for precise fine processing in that they minimize the above-mentioned resist film thickness changes and bubble formation since only a small amount of the dissolution inhibitor to be decomposed with acid may be used. The dissolution inhibitors which were proposed for positive resists in the prior art are bisphenol A derivatives wherein OH groups are converted into t-BOC groups and tetrahydroxybenzophenone having t-BOC groups incorporated. Three-component resist compositions containing such dissolution inhibitors have the advantage of increased sensitivity, but suffer from the problem that oxygen plasma etching resistance is lost unless silicone-containing compounds are used as the inhibitor. It then occurred to us that the oxygen plasma etching resistance would be enhanced by using silicone compounds as the dissolution inhibitor.

Making investigations on the dissolution inhibitor which provides a highly sensitive resist suited for fine processing and having high oxygen plasma etching resistance, we have found that the silicone compounds of formula (3) to (5) wherein the carboxyl or hydroxyl group is protected with a t-butyl or t-butoxycarbonylmethyl group are effective for producing a pattern having high sensitivity and high resolution and thus achieving the above-mentioned object.

DETAILED DESCRIPTION OF THE INVENTION

Any of the positive resist compositions in the first to third aspects of the invention are based on a silicone polymer of the general formula (1):

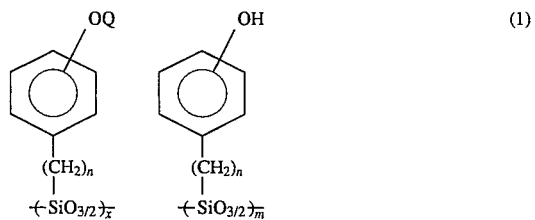
(1)

Herein, Q is a t-butoxycarbonyl, t-butoxycarbonylmethyl, trimethylsilyl or tetrahydropyranyl group. Letter n is an integer of 1 to 3. Letters x and m are numbers satisfying x+m=1 while x is a positive number (x>0) and m is equal to 0 or a positive number (m≧0). Where x is small, however, only a small dissolution inhibition effect is exerted and addition of a dissolution inhibitor is essential. As x increases, the polymer is reduced in alkali solubility and the inhibitor becomes needless. Preferably x is 0.05 to 0.5. With x of less than 0.05, the dissolution inhibition effect is low. With x of more than 0.5, there is a probability that oxygen plasma etching resistance will be low as the silicone content decreases. Also with x of more than 0.5, the silicone polymer would have a very low solubility in aqueous base so that an outstanding decline of sensitivity is inevitable with commonly used developers.

The silicone polymer used herein preferably has a weight average molecular weight of 5,000 to 50,000. Silicone polymers with a Mw of less than 5,000 would be less resistant to plasma and less inhibitory against dissolution in aqueous base. Silicone polymers with a Mw of more than 50,000 would be less soluble in commonly used resist solvents.

It is noted that conversion of an OH group of hydroxybenzyl into a t-BOC group is commonly used in peptide synthesis as a useful method for protecting a functional group and can be carried out simply by reacting a silicone polymer with di-t-butyl dicarbonate in pyridine solution. Protection of an OH group with a t-butoxycarbonylmethyloxy group can be achieved by reacting a silicone polymer with t-butyl bromoacetate.

Protection of an OH group with a trimethylsilyl group can be carried out in a substantially quantitative manner by reacting with trimethylsilyl chloride in the presence of a base such as triethylamine and pyridine.

Protection of an OH group with a tetrahydropyranyl group can be carried out by reacting with dihydropyrane in the presence of a weak acid.

Since the t-butoxycarbonylmethyloxy group generates a carboxyl group upon decomposition with a catalytic acid, the silicone polymer protected therewith is superior in solubility and resolution to those polymers protected with t-BOC, trimethylsilyl and tetrahydropyranyl groups.

In the practice of the invention, the silicone polymer is preferably used in an amount of at least 55% by weight, especially at least 80% by weight of the total weight of all components of two or three-component system compositions (excluding the organic solvent). With a silicone polymer content of less than 55%, the resulting resist composition would be less effective to coat or would form a relatively weak resist film.

In the first aspect, the positive resist composition of the invention is a two component system comprising a silicone polymer of formula (1) and a photo acid generator which will decompose to generate an acid upon exposure to radiation, or a three component system further comprising a dissolution inhibitor. In either case, the resist composition is developable with alkaline aqueous solution.

The photo acid generator used herein is an onium salt of the general formula (2).

In formula (2), R is a substituted or unsubstituted aromatic group. J is sulfonium or iodonium. M is a p-toluenesulfonate or trifluoromethanesulfonate group. Letter p is equal to 2 or 3. At least one of the R groups is a phenyl group having a t-alkoxy substituent represented by the following formula (2a), a t-butoxycarbonyloxy substituent represented by the following formula (2) or a t-butoxycarbonylmethoxy substituent represented by the following formula (2c):

wherein R' is a substituted or unsubstituted monovalent hydrocarbon group having 1 to 10 carbon atoms, for example, alkyl and aryl groups, and t-Bu is a t-butyl group. Examples of the substituted or usubstituted aromatic group represented by R other than the above-mentioned ones include phenyl, methyl, methoxy, ethoxy, t-butyl, and halogen.

Examples of the onium salt of formula (2) are given below. Note that the onium salts of formula (2) are more soluble as more R groups are replaced by t-alkoxy, t-butoxycarbonyloxy or t-butoxycarbonylmethoxy groups.

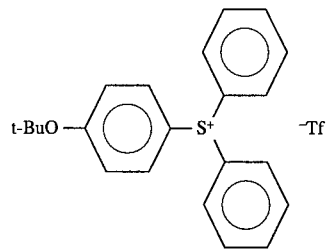

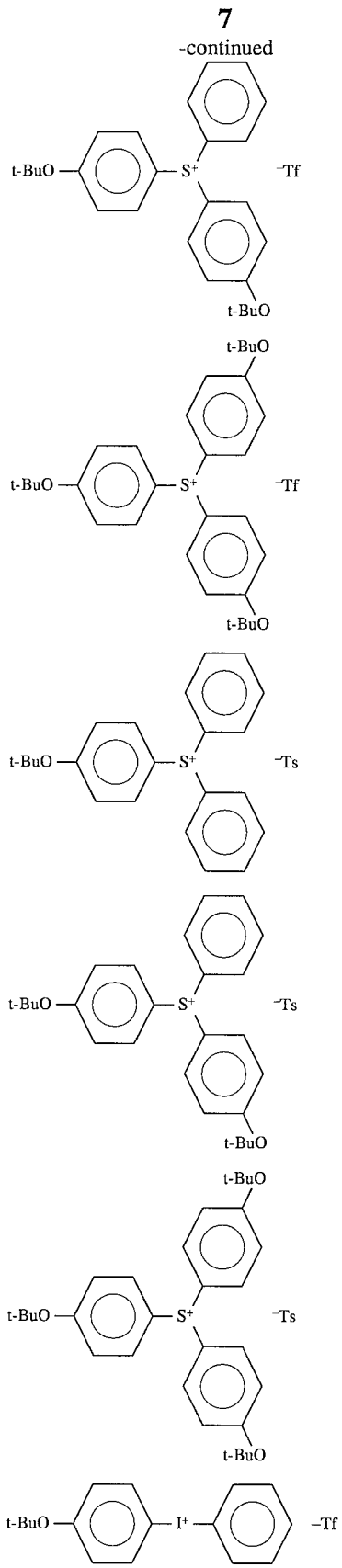

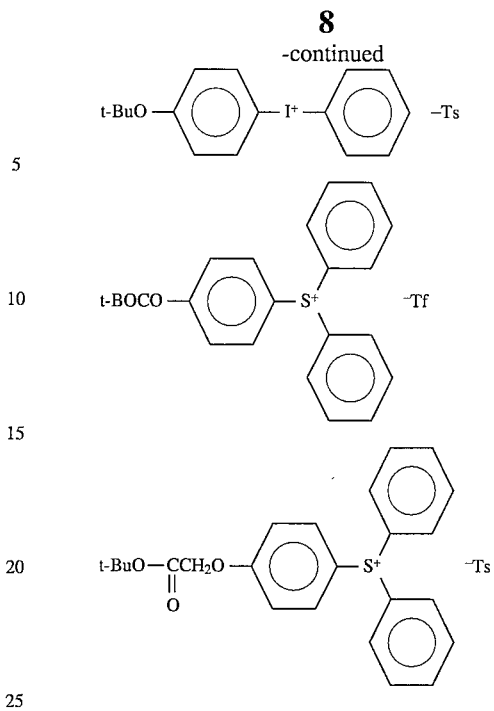

In the formulae, Tf stands for trifluoromethanesulfonate, Ts for p-toluenesulfonate, and t-BOC for a t-butoxycarbonyl group.

Preferably the onium salt or photo acid generator is contained in an amount of 0.5 to 15% by weight, especially 1 to 10% by weight of the entire composition. A composition containing less than 0.5% of an onium salt exhibits positive resist performance, but is less sensitive. The resist increases its sensitivity and contrast ($\gamma$) as the amount of the onium salt increases. A composition containing more than 15% of an onium salt exhibits positive resist performance. However, since no further improvement in sensitivity is expected from excessive contents, the onium salt is an expensive reagent, and an increased content of a low molecular weight component in the resist reduces the mechanical strength and oxygen plasma resistance of a resist film, the onium salt content should preferably be 15% or less.

The positive resist composition according to the first aspect of the invention may be either a two component system comprising a silicone polymer of formula (1) and an onium salt of formula (2) or a three component system further comprising a dissolution inhibitor.

The dissolution inhibitor used herein may be any of dissolution inhibitors used in conventional three-component resist compositions, for example, bisphenol A derivatives wherein OH groups are converted into t-BOC groups as shown by the following formula:

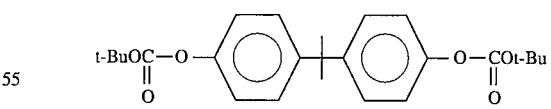

and tetrahydroxybenzophenone having t-BOC groups incorporated therein.

Preferably the dissolution inhibitor is contained in an amount of up to 40% by weight, especially 10 to 30% by weight of the entire composition. More than 40% of the dissolution inhibitor would significantly detract from oxygen plasma resistance and restrain use as a two-layer resist.

In the second aspect, the positive resist composition of the invention is a two component system comprising a silicone polymer of formula (1) and a photo acid generator which will decompose to generate an acid upon exposure to radiation. A nitrogenous compound is added to the composition. The resist composition is developable with alkaline aqueous solution. If desired, the composition further contains a dissolution inhibitor.

The nitrogenous compounds used herein include those compounds which are liquid at room temperature, for example, N-methylaniline, toluidine and N-methylpyrrolidone, and those compounds which are solid at room temperature, for example, aminobenzoic acid and phenylenediamine. Since most liquid compounds have a low boiling point and evaporate off during pre-baking of resist films, they are not effective for the purpose. For this reason, preferred nitrogenous compounds are o-aminobenzoic acid, m-aminobenzoic acid, p-aminobenzoic acid, o-phenylenediamine, m-phenylenediamine, p-phenylenediamine, and diphenylamine.

Preferably the nitrogenous compound is contained in an amount of 0.01 to 1% by weight, especially 0.1 to 0.5% by weight of the entire composition. Less than 0.01% of the nitrogenous compound would be ineffective whereas more than 1% of the nitrogenous compound would cause a significant drop of sensitivity.

Blended in the composition of the second embodiment is a photo acid generator which will decompose to generate an acid upon exposure to high energy radiation such as deep-UV line, electron beam and X-ray. Exemplary photo acid generators include oxime sulfonic acid derivatives, 2,6-dinitrobenzylsulfonic acid derivatives, naphthoquinone-4-sulfonic acid derivatives, 2,4-bistrichloromethyl-6-aryl-1,3,5-triazine derivatives, and α,α'-bisarylsulfonyldiazomethanes.

Other useful photo acid generators are onium salts of the general formula (6):

$(R^3)_pJM$      (6)

wherein $R^3$ is independently selected from substituted or unsubstituted aromatic groups, J is sulfonium or iodonium, M is a p-toluenesulfonate or trifluoromethanesulfonate group, and letter p is equal to 2 or 3. Examples of the substituted and unsubstituted aromatic groups are as described for formula (2). Typical examples of the onium salt are given below.

$(C_6H_5)_2I^+{}^-O_3SCF_3$ $(C_6H_5)_3S^+{}^-O_3SCF_3$ $(C_6H_5SC_6H_4)(C_6H_5)_2S^+{}^-O_3SCF_3$ $(C_6H_5)_2I^+{}^-O_3S\phi CH_3$ $(t\text{-Butyl-}C_6H_4)_2I^+{}^-O_3SCF_3$ $(C_6H_5)(MeOC_6H_5)I^+{}^-O_3S\phi CH_3$ It is noted that $\phi$ is $C_6H_4$. The most preferred photo acid generators are the onium salts of formula (2).

As in the first embodiment, the photo acid generator is contained in an amount of 0.5 to 15% by weight, especially 1 to 10% by weight of the entire composition in the second embodiment.

The positive resist composition of the second embodiment may be either a two component system comprising a silicone polymer of formula (1) and a photo acid generator or a three component system further comprising a dissolution inhibitor.

The dissolution inhibitor used herein may be any of dissolution inhibitors used in conventional three-component resist compositions, and its examples and amount are the same as described in conjunction with the first embodiment.

In the third aspect, the positive resist composition of the invention is a three component system comprising a silicone polymer of formula (1), a photo acid generator which will decompose to generate an acid upon exposure to radiation, and a dissolution inhibitor. The resist composition is developable with alkaline aqueous solution.

The dissolution inhibitor used in the third embodiment is a silicone compound of the following general formula (3), (4) or (5) wherein a carboxyl or hydroxyl group thereof is protected with a t-butyl or t-butoxycarbonylmethyl group.

  (3)

  (4)

  (5)

In these formulae, $R^1$ is a methyl or phenyl group, $R^2$ is a carboxyethyl or p-hydroxyphenylalkyl group, X is a trimethylsilyl, triphenylsilyl or $—SiR_2{}^1R^2$ wherein $R^1$ and $R^2$ are as defined above, letter a is an integer of 0 to 50, b is an integer of 1 to 50, and c is an integer of 3 to 10.

Examples of the silicone compounds of formulae (3), (4) and (5) wherein a carboxyl or hydroxyl group thereof is protected with an alkali-soluble group, that is, t-butyl or t-butoxycarbonylmethyl group are given below. Classes A, B and C correspond to formulae (3), (4) and (5), respectively.

Class A

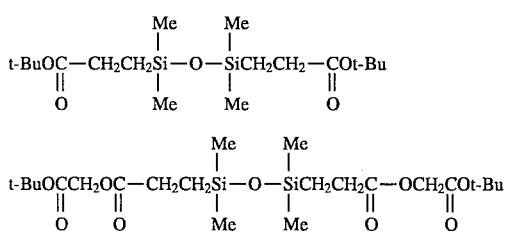

-continued

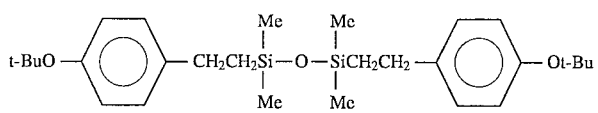

Class B

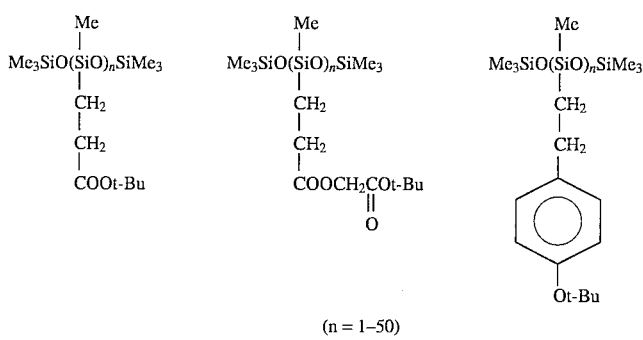

(n = 1–50)

Class C

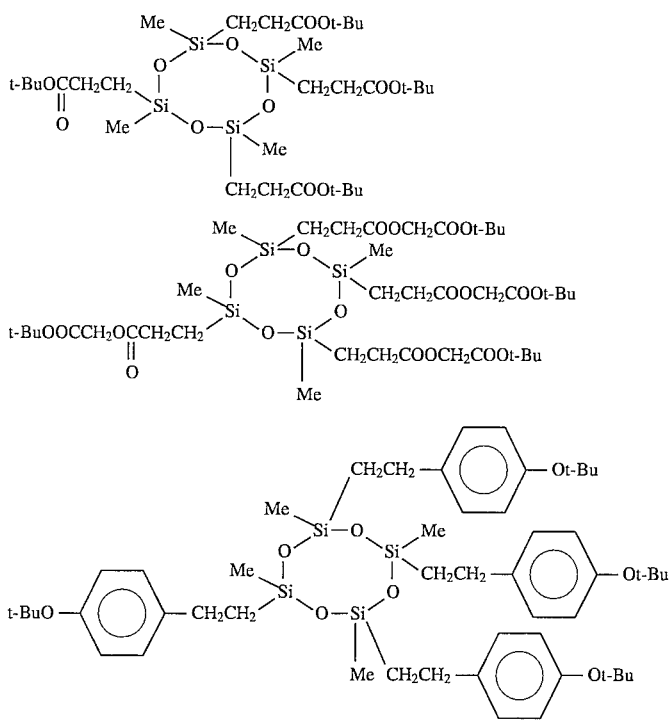

The dissolution inhibitor is preferably contained in an amount of up to 40% by weight, especially 10 to 30% by weight of the entire composition. More than 40% of the dissolution inhibitor would significantly detract from oxygen plasma resistance and restrain use as a two-layer resist.

The photo acid generator used in the resist composition of the third embodiment may be the same as in the second embodiment, especially the onium salts of formula (2). The amount of the photo acid generator used is the same as in the first and second embodiments.

It is understood that a nitrogenous compound as described in the second embodiment may also be blended in the resist composition of the third embodiment.

The resist compositions of the first to third embodiments are prepared by dissolving the respective essential and optional components in an organic solvent. Use may be made of organic solvents in which these components are soluble and which allow for uniform spreading of a resist film. Examples include butyl acetate, xylene, acetone, cellosolve acetate, ethylene glycol monomethyl ether, diethylene glycol monomethyl ether, ethylene glycol monoethyl ether, diethylene glycol dibutyl ether, diethylene glycol dimethyl ether, ethyl lactate, methyl lactate, propyl lactate, and butyl lactate. These organic solvents may be used alone or in admixture. The amount of the organic solvent used is several times the total amount of the resist components.

If desired, a surface-active agent and other suitable additives may be blended in the resist compositions of the invention.

A resist pattern is formed from the resist composition of the invention, for example, by the following procedure. A resist solution formulated according to the invention is spin coated onto a substrate, pre-baked, and imagewise exposed to high energy radiation. At this point, the photo acid generator decomposes to generate an acid. After exposure, the resist film is baked. During this post-exposure baking (PEB), the acid catalyzes decomposition of an acid labile group so that the dissolution inhibitory effect is lost. Thereafter, the resist film is developed with an aqueous alkaline solution and rinsed with water, obtaining a positive resist pattern.

The resist of the invention is useful as a two-layer resist since it uses a silicone polymer as the base resin and is fully resistant to oxygen plasma etching. More particularly, a relatively thick organic polymer layer is formed on a substrate as a lower resist layer before a resist solution formulated according to the invention is spin coated thereon. The upper resist film of the invention is processed as above to form a resist pattern. Thereafter, the resist layers are subject to oxygen plasma etching. The lower resist layer is selectively etched away whereby the pattern of the upper resist layer is formed in the lower resist layer.

For the lower resist layer, a novolak resin based positive resist composition may be used. After it is coated onto a substrate, it is subject to hard baking at 200° C. for one hour, thereby preventing intermixing with the overlying silicone base resist composition.

There has been described a positive working resist composition which is sensitive to high energy radiation, has superior sensitivity and resolution, and lends itself to fine processing technology using electron beam and deep-UV line. Because of very low absorption at the exposure wavelength of KrF excimer laser, the resist composition forms a fine pattern having a wall perpendicular to the substrate. Because of the high oxygen plasma etching resistance of the resist composition of the invention, a two-layer resist having a resist film of the invention coated on a lower resist layer can be finely patterned at a high aspect ratio.

EXAMPLE

Examples of the present invention are given below by way of illustration and not by way of limitation. All parts are by weight.

Synthesis Example 1

Synthesis of polyhydroxyphenylalkylsilsesquioxane (a) o-hydroxyphenylpropylsilsesquioxane A reactor was charged with 600 ml of water. With stirring at 30° C., a mixture of 283.5 g (1 mol) of o-methoxyphenylpropyltrichlorosilane and 300 ml of toluene was added dropwise to water over 2 hours for hydrolysis. By separatory operation, the water layer was removed and the organic layer was distilled of the solvent by means of an evaporator. The concentrate was heated under vacuum at 200° C. for 2 hours for polymerization. The polymer was dissolved in 200 g of acetonitrile. While the solution was kept below 60° C., 240 g of trimethylsilyliodide was added dropwise thereto and reaction was carried out at 60° C. for 10 hours. After the completion of reaction, 200 g of water was added to the reaction solution for hydrolysis. The polymer layer was collected by decantation and dried in vacuum, obtaining 192 g of poly(o-hydroxyphenylpropylsilsesquioxane).

(b) p-hydroxyphenylethylsilsesquioxane

Synthesis was carried out as in (a) except that p-methoxyphenylethyltrichlorosilane was used instead of o-methoxyphenylpropyltrichlorosilane, obtaining 186 g of poly(p-hydroxyphenylethylsilsesquioxane).

(c) p-hydroxybenzylsilsesquioxane

Synthesis was carried out as in (a) except that p-methoxybenzyltrichlorosilane was used instead of o-methoxyphenylpropyltrichlorosilane, obtaining 165 g of poly(p-hydroxybenzylsilsesquioxane).

Synthesis Example 2

Protection of poly(hydroxyphnylalkylsilsesquioxane) with t-butoxycarbonyl (t-BOC)

In 250 g of pyridine was dissolved 25 g of poly(hydroxybenzylsilsesquioxane) of Synthesis Example 1(c). With stirring at 45° C., 6.85 g (0.031 mol, corresponding to about 20 mol% based on OH group) of di-t-butyl dicarbonate was added. Gas evolved at the same time as addition and reaction was carried out in a nitrogen gas stream for 1½ hours. The reaction solution was stripped of the pyridine, dissolved in 100 ml of methanol, and added dropwise to 5 liters of water, yielding a white precipitate. The precipitate was washed 5 times with water, filtered, and dried in vacuum below 40° C., to give 25 g of t-butoxycarbonylated poly(hydroxybenzylsilsesquioxane). This is designated Synthesis Example 2(c). The product was analyzed by proton-NMR. From a peak of phenyl at 6 to 7 ppm and peaks of t-butyl and methylene at 1 to 2 ppm, the t-BOC introduction rate was calculated to be 19.6%.

Similarly, the polymers of Synthesis Example 1(a) and 1(b) were protected with a t-butoxycarbonyl (t-BOC) group. The product of Synthesis Example 2(a) had a t-BOC rate of 19.5% and the product of Synthesis Example 2(b) had a t-BOC rate of 19.8%.

Synthesis Example 3 t-butoxycarbonylmethalation of poly(hydroxypbenylalkylsilsesquioxane)

In 250 g of pyridine was dissolved 25 g of poly(hydroxybenzylsilsesquioxane) of Synthesis Example 1(c). With stirring at 45° C., 8.89 g (0.045 mol) of t-butyl bromoacetate was added. Reaction was carried out in a nitrogen gas stream for 5 hours. The reaction solution was stripped of the pyridine, dissolved in 100 ml of methanol, and added dropwise to 5 liters of water, yielding a white precipitate. The precipitate was washed 5 times with water, filtered, and dried in vacuum below 40° C., to give 25 g of t-butoxycarbonylmethyloxy-bearing poly(hydroxybenzylsilsesquioxane). The product was analyzed by proton-NMR. From a peak of phenyl at 6 to 7 ppm and peaks of t-butyl and methylene at 1 to 2 ppm, the t-butoxycarbonylmethyloxy introduction rate was calculated to be 20.6%.

Synthesis Example 4

Trimethylsilylation of poly(hydroxyphenylalylsilsesquioxane)

In 40 ml of acetone was dissolved 25 g of poly(hydroxybenzylsilsesquioxane) of Synthesis Example 1(c). 5.2 g of trimethylamine was added thereto. With stirring at 45° C., 0.95 g of trimethylsilylchloride was added. The reaction solution was aged by refluxing for 2 hours. The reaction solution was stripped of the acetone, dissolved in 100 ml of methanol, and added dropwise to 5 liters of water, yielding a white precipitate. The precipitate was washed 5 times with water, filtered, and dried in vacuum below 40° C., to give 25 g of trimethylsilylated poly(hydroxybenzylsilsesquioxane). The product was analyzed by proton-NMR. From a peak of phenyl at 6 to 7 ppm and a peak of methyl of trimethylsilyl at about 0 ppm, the trimethylsilyl introduction rate was calculated to be 19.0%.

Synthesis Example 5

Protection of poly(hydroxyphenylalkylsilsesquioxane) with tetrahydropyranyl

In 40 ml of acetone was dissolved 25 g of poly(hydroxybenzylsilsesquioxane) of Synthesis Example 1(c). 7.5 g of pyridinium tosylate was added thereto. With stirring at room temperature, 12.9 g of dihydropyrane was added over one hour. The reaction solution was aged at room temperature for 10 hours. The reaction solution was stripped of the acetone, dissolved in 100 ml of methanol, and added dropwise to 5 liters of water, yielding a white precipitate. The precipitate was washed 5 times with water, filtered, and dried in vacuum below 40° C., to give 20 g of tetrahydropyranyl-bearing poly(hydroxybenzylsilsesquioxane). The product was analyzed by proton-NMR. From a peak of phenyl at 6 to 7 ppm and a peak of hydrogen at the alpha-position of tetrahydropyranyl at 5.5 ppm, the tetrahydropyranyl introduction rate was calculated to be 18.9%.

In the following Examples, especially in Tables, the polymers of Synthesis Examples 1 to 5 are simply referred to by their acronyms SE 1 to SE 5, respectively. Also, S stands for sulfonium, I for iodonium, Ts for p-toluenesulfonate, and Tf for trifluoromethanesulfonate.

Example 1

A resist solution was prepared from the following ingredients.

|  | pbw |
|---|---|
| Base resin (Synthesis Example 2(c)) | 96 |
| Tri(p-t-butoxyphenyl)trifluoromethane sulfonate | 4 |
| 1-ethoxy-2-propanol | 600 |

It was spin coated onto a silicon substrate at 2,000 rpm and pre-baked on a hot plate at 85° C. for one minute, obtaining a film of 0.4 μm thick. The resist film was exposed imagewise to KrF excimer laser or an electron beam at an accelerating voltage of 30 kV, baked (PEB) at 85° C. for 2 minutes, and developed with an aqueous solution of 2.4% tetramethylammonium hydroxide (TMAH) for one minute, and rinsed with water for 30 seconds.

The resist material was positive working and had a $D_0$ sensitivity of 3 μC/cm$^2$ and an Eth sensitivity of 4.0 mJ/cm$^2$ as evaluated using KrF excimer laser (wavelength 248 nm) as deep-UV radiation instead of the electron beam. The base resin used herein had a dissolution rate of 35 nm/s in the developer. The resist material had a dissolution rate of about 1.5 nm/s in unexposed areas and a dissolution rate of 40 nm/s in exposed areas after PEB.

Upon imagewise exposure with the KrF excimer laser, a 0.25 μm line-and-space pattern and a hole pattern could be resolved and a pattern having a side wall perpendicular to the substrate was formed. Upon imagewise exposure with the electron beam, a resolution to 0.1 μm was possible.

Examples 2–33

Resist solutions were prepared as in Example 1 except that the base resin and photo acid generator shown in Table 1 were used. They were similarly coated on silicon wafer substrates and exposed to KrF excimer laser. The Eth sensitivity and resolution or line-and-space width are reported in Table 1.

Example 34

A resist solution was prepared from the following ingredients.

|  | pbw |
|---|---|
| Base resin (Synthesis Example 2(c)) | 80 |
| Tri(p-t-butoxyphenyl)trifluoromethane sulfonate | 4 |
| t-BOC-bearing bisphenol A | 16 |
| 1-ethoxy-2-propanol | 600 |

As in Example 1, it was spin coated onto a silicon substrate at 2,000 rpm and pre-baked on a hot plate at 85° C. for one minute, obtaining a film of 0.4 μm thick. The resist film was exposed imagewise to KrF excimer laser.

The resist material had an Eth sensitivity of 20 mJ/cm$^2$ and a resolution or line-and-space width of 0.22 μm.

Examples 35–37

Resist solutions were prepared as in Example 34 except that the base resin, photo acid generator and dissolution inhibitor shown in Table 2 were used. They were similarly coated on silicon wafer substrates and exposed to KrF excimer laser. The Eth sensitivity and resolution or line-and-space width are reported in Table 2.

TABLE 1

| Example | Base resin | Acid generator | Eth (mJ/cm$^2$) | Resolution (μm) |
|---|---|---|---|---|
| 1 | Polymer of SE 2(c) | tri(p-t-butoxyphenyl) S-Tf | 5.0 | 0.22 |
| 2 | Polymer of SE 2(c) | di(p-t-butoxyphenyl)phenyl S-Tf | 4.5 | 0.22 |
| 3 | Polymer of SE 2(c) | (p-t-butoxyphenyl)diphenyl S-Tf | 4.5 | 0.25 |
| 4 | Polymer of SE 2(a) | tri(p-t-butoxyphenyl) S-Tf | 5.0 | 0.22 |
| 5 | Polymer of SE 2(a) | di(p-t-butoxyphenyl)phenyl S-Tf | 5.0 | 0.22 |
| 6 | Polymer of SE 2(a) | (p-t-butoxyphenyl)diphenyl S-Tf | 4.5 | 0.25 |
| 7 | Polymer of SE 2(b) | tri(p-t-butoxyphenyl) S-Tf | 5.0 | 0.22 |
| 8 | Polymer of SE 2(b) | di(p-t-butoxyphenyl)phenyl S-Tf | 4.5 | 0.22 |
| 9 | Polymer of SE 2(b) | (p-t-butoxyphenyl)diphenyl S-Tf | 4.0 | 0.25 |
| 10 | Polymer of SE 3 | tri(p-t-butoxyphenyl) S-Tf | 6.0 | 0.22 |
| 11 | Polymer of SE 3 | di(p-t-butoxyphenyl)phenyl S-Tf | 6.0 | 0.25 |
| 12 | Polymer of SE 3 | (p-t-butoxyphenyl)diphenyl S-Tf | 6.0 | 0.25 |
| 13 | Polymer of SE 3 | di(p-t-butoxyphenyl) I-Tf | 5.0 | 0.22 |
| 14 | Polymer of SE 3 | (p-t-butoxyphenyl)phenyl I-Tf | 5.5 | 0.25 |

TABLE 1-continued

| Example | Base resin | Acid generator | Eth (mJ/cm²) | Resolution (μm) |
|---|---|---|---|---|
| 15 | Polymer of SE 3 | tri(p-t-butoxyphenyl) S-Ts | 9.0 | 0.22 |
| 16 | Polymer of SE 3 | di(p-t-butoxyphenyl)phenyl S-Ts | 8.0 | 0.25 |
| 17 | Polymer of SE 3 | (p-t-butoxyphenyl)diphenyl S-Ts | 8.0 | 0.25 |
| 18 | Polymer of SE 3 | di(p-t-butoxyphenyl) I-Ts | 7.0 | 0.25 |
| 19 | Polymer of SE 3 | (p-t-butoxyphenyl)phenyl I-Ts | 7.5 | 0.28 |
| 20 | Polymer of SE 3 | (p-butoxycarbonyloxyphenyl)-diphenyl S-Tf | 5.0 | 0.22 |
| 21 | Polymer of SE 3 | (p-butoxycarbonyloxyphenyl)-phenyl I-Tf | 5.0 | 0.22 |
| 22 | Polymer of SE 4 | tri(p-t-butoxyphenyl) S-Tf | 6.0 | 0.25 |
| 23 | Polymer of SE 4 | di(p-t-butoxyphenyl)phenyl S-Tf | 5.5 | 0.28 |
| 24 | Polymer of SE 4 | (p-t-butoxyphenyl)diphenyl S-Tf | 5.5 | 0.28 |
| 25 | Polymer of SE 4 | tri(p-t-butoxyphenyl) S-Ts | 10.0 | 0.25 |
| 26 | Polymer of SE 4 | di(p-t-butoxyphenyl)phenyl S-Ts | 9.0 | 0.28 |
| 27 | Polymer of SE 4 | (p-t-butoxyphenyl)diphenyl S-Ts | 9.0 | 0.28 |
| 28 | Polymer of SE 5 | tri(p-t-butoxyphenyl) S-Tf | 7.0 | 0.25 |
| 29 | Polymer of SE 5 | di(p-t-butoxyphenyl)phenyl S-Tf | 7.0 | 0.30 |
| 30 | Polymer of SE 5 | (p-t-butoxyphenyl)diphenyl S-Tf | 7.0 | 0.30 |
| 31 | Polymer of SE 5 | tri(p-t-butoxyphenyl) S-Ts | 12.5 | 0.30 |
| 32 | Polymer of SE 5 | di(p-t-butoxyphenyl)phenyl S-Ts | 12.0 | 0.30 |
| 33 | Polymer of SE 5 | (p-t-butoxyphenyl)diphenyl S-Ts | 11.5 | 0.30 |

TABLE 2

| Example | Base resin | Acid generator | Dissolution inhibitor | Eth (mJ/cm²) | Resolution (μm) |
|---|---|---|---|---|---|
| 34 | Polymer of SE 2(c) | tri(p-t-butoxyphenyl) S-Tf | t-BOC bisphenol A | 4.5 | 0.22 |
| 35 | Polymer of SE 3 | tri(p-t-butoxyphenyl) S-Tf | t-BOC bisphenol A | 6.0 | 0.22 |
| 36 | Polymer of SE 5 | tri(p-t-butoxyphenyl) S-Tf | t-BOC bisphenol A | 6.0 | 0.25 |
| 37 | Polymer of SE 5 | tri(p-t-butoxyphenyl) S-Tf | t-BOC bisphenol A | 7.0 | 0.28 |

Example 38

A resist solution of the same composition as in Example 1 was prepared. A silicon wafer was coated with a lower resist film of 2 μm thick using OFPR 800 (Tokyo Oka K.K.), and the film was cured by heating at 200° C. for one hour. As in Example 1, the resist solution was coated onto the lower resist film to a thickness of about 0.4 μm and pre-baked. As in Example 1, the resist film was exposed to an electron beam or KrF excimer laser and developed, forming a pattern on the lower resist film.

Using a parallel plate type sputter etching apparatus, the resist was etched with oxygen gas as an etchant gas. The etching conditions are shown below.

Gas flow rate: 50 SCCM
Gas pressure: 1.3 Pa
RF power: 50 watts
DC bias: 450 volts The lower resist film was etched at a rate of 150 nm/min. while the upper resist film of the composition of Example 1 was etched at a rate of less than 3 nm/min. After 15 minutes of etching, those portions of the lower resist film which were not covered with the upper resist film were completely eliminated, leaving a two-layer resist pattern having a thickness of more than 2 μm.

Examples 39–70

Two-layer resists were prepared and etched as in Example 38 except that the resist materials of Examples 2 to 33 were used instead of the resist of Example 1, forming equivalent resist patterns.

Example 71

A resist solution was prepared from the following ingredients.

| | pbw |
|---|---|
| Base resin (Synthesis Example 2(c)) | 96 |
| Tri(p-t-butoxyphenyl)trifluoromethane sulfonate | 4 |
| N-methylpyrrolidone | 0.4 |
| 1-ethoxy-2-propanol | 600 |

It was spin coated onto a silicon substrate at 2,000 rpm and pre-baked on a hot plate at 85° C. for one minute, obtaining a film of 0.4 μm thick. The resist film was exposed imagewise to KrF excimer laser or an electron beam at an accelerating voltage of 30 kV, baked (PEB) at 85° C. for 2 minutes, and developed with an aqueous solution of 2.4% tetramethylammonium hydroxide (TMAH) for one minute, and rinsed with water for 30 seconds.

The resist material was positive working and had a $D_0$ sensitivity of 4.5 μC/cm² and an Eth sensitivity of 10 mJ/cm² as evaluated using KrF excimer laser (wavelength 248 nm) as deep-UV radiation instead of the electron beam. The base resin used herein had a dissolution rate of 35 nm/s in the developer. The resist material had a dissolution rate of about 1.5 nm/s in unexposed areas and a dissolution rate of 40 nm/s in exposed areas after PEB.

Upon imagewise exposure with the KrF excimer laser, a 0.25 μm line-and-space pattern and a hole pattern could be resolved and a pattern having a side wall perpendicular to the substrate was formed. Upon imagewise exposure with the electron beam, a resolution to 0.1 μm was possible.

Note that when the resist film was allowed to stand for 20 minutes in air after the KrF excimer laser exposure and thereafter subject to post-exposure baking (PEB), a T-top profile was recognized. A line-and-space width of 0.30 μm could be resolved.

Examples 72–88

Resist solutions were prepared as in Example 1 except that the base resin, photo acid generator and nitrogenous compound shown in Table 3 were used. They were similarly coated on silicon wafer substrates and exposed to KrF excimer laser. The Eth sensitivity and resolution or line-and-space width are reported in Table 3 together with the resolution achieved when PEB was delayed over 20-minute atmospheric standing after exposure.

Example 89

A resist solution was prepared from the following ingredients.

|  | pbw |
|---|---|
| Base resin (Synthesis Example 2(c)) | 80 |
| Tri(p-t-butoxyphenyl)trifluoromethane sulfonate | 4 |
| t-BOC-bearing bisphenol A | 16 |
| N-methylpyrrolidone | 0.4 |
| 1-ethoxy-2-propanol | 600 |

As in Example 71, it was spin coated onto a silicon substrate at 2,000 rpm and pre-baked on a hot plate at 85° C. for one minute, obtaining a film of 0.4 μm thick. The resist film was exposed imagewise to KrF excimer laser. The resist had an Eth sensitivity of 10 mJ/cm$^2$ and a resolution or line-and-space width of 0.25 μm.

Examples 90–91

Resist solutions were prepared as in Example 89 except that the nitrogenous compounds shown in Table 4 were used. They were similarly coated on silicon wafer substrates and exposed to KrF excimer laser. The Eth sensitivity and resolution or line-and-space width are reported in Table 4.

TABLE 3

| Example No. | Base resin | Acid generator | Nitrogenous compound | Eth (mJ/cm$^2$) | Resolution (μm) | PED resolution (μm) |
|---|---|---|---|---|---|---|
| 71 | SE 2(c) | tri(p-t-butoxyphenyl) S-Tf | N-methylpyrrolidone | 10.0 | 0.25 | 0.30 |
| 72 | SE 2(c) | tri(p-t-butoxyphenyl) S-Tf | o-aminobenzoic acid | 10.0 | 0.25 | 0.30 |
| 73 | SE 2(c) | tri(p-t-butoxyphenyl) S-Tf | m-aminobenzoic acid | 10.0 | 0.25 | 0.30 |
| 74 | SE 2(c) | tri(p-t-butoxyphenyl) S-Tf | p-aminobenzoic acid | 10.0 | 0.25 | 0.30 |
| 75 | SE 2(c) | tri(p-t-butoxyphenyl) S-Tf | o-phenylenediamine | 10.0 | 0.25 | 0.30 |
| 76 | SE 2(c) | tri(p-t-butoxyphenyl) S-Tf | m-phenylenediamine | 12.0 | 0.25 | 0.32 |
| 77 | SE 2(c) | tri(p-t-butoxyphenyl) S-Tf | p-phenylenediamine | 15.0 | 0.28 | 0.32 |
| 78 | SE 2(c) | tri(p-t-butoxyphenyl) S-Tf | diphenylamine | 10.0 | 0.28 | 0.30 |
| 79 | SE 2(c) | tri(p-t-butoxyphenyl) S-Tf | aniline | 5.0 | 0.25 | 0.40 |
| 80 | SE 3 | tri(p-t-butoxyphenyl) S-Tf | N-methylpyrrolidone | 12.0 | 0.25 | 0.30 |
| 81 | SE 3 | tri(p-t-butoxyphenyl) S-Tf | m-aminobenzoic acid | 12.0 | 0.25 | 0.30 |
| 82 | SE 3 | tri(p-t-butoxyphenyl) S-Tf | p-phenylenediamine | 14.0 | 0.28 | 0.30 |
| 83 | SE 3 | tri(p-t-butoxyphenyl) S-Ts | N-methylpyrrolidone | 18.0 | 0.28 | 0.28 |
| 84 | SE 3 | tri(p-t-butoxyphenyl) S-Ts | m-aminobenzoic acid | 18.0 | 0.28 | 0.28 |
| 85 | SE 3 | tri(p-t-butoxyphenyl) S-Ts | p-phenylenediamine | 21.0 | 0.28 | 0.28 |
| 86 | SE 4 | tri(p-t-butoxyphenyl) S-Tf | N-methylpyrrolidone | 10.0 | 0.25 | 0.32 |
| 87 | SE 4 | tri(p-t-butoxyphenyl) S-Ts | N-methylpyrrolidone | 18.0 | 0.28 | 0.30 |
| 88 | SE 5 | tri(p-t-butoxyphenyl) S-Tf | N-methylpyrrolidone | 18.0 | 0.30 | 0.35 |

TABLE 4

| No. | Base resin | Acid generator | Dissolution inhibitor | Nitrogenous compound | Eth (mJ/cm$^2$) | Resolution (μm) |
|---|---|---|---|---|---|---|
| 89 | SE 2(c) | tri(p-t-butoxyphenyl) S-Tf | t-BOC bisphenol A | N-methyl-pyrrolidone | 10.0 | 0.25 |
| 90 | SE 2(c) | tri(p-t-butoxyphenyl) S-Tf | t-BOC bisphenol A | o-amino-benzoic acid | 10.0 | 0.25 |
| 91 | SE 2(c) | tri(p-t-butoxyphenyl) S-Tf | t-BOC bisphenol A | p-phenylene-diamine | 15.0 | 0.28 |

Example 92

A resist solution of the same composition as in Example 71 was prepared. A silicon wafer was coated with a lower resist film of 2 μm thick using OFPR 800 (Tokyo Oka K.K.), and the film was cured by heating at 200° C. for one hour. As in Example 71, the resist solution was coated onto the lower resist film to a thickness of about 0.4 μm and prebaked. As in Example 71, the resist film was exposed to an electron beam or KrF excimer laser and developed, forming a pattern on the lower resist film.

Using a parallel plate type sputter etching apparatus, the resist was etched with oxygen gas as an etchant gas. The etching conditions are shown below.

Gas flow rate: 50 SCCM
Gas pressure: 1.3 Pa
RF power: 50 watts
DC bias: 450 volts The lower resist film was etched at a rate of 150 nm/min. while the upper resist film of the composition of Example 71 was etched at a rate of less than 3 nm/min. After 15 minutes of etching, those portions of the lower resist film which were not covered with the upper resist film were completely eliminated, leaving a two-layer resist pattern having a thickness of more than 2 μm.

Examples 93–112

Two-layer resists were prepared and etched as in Example 92 except that the resist materials of Examples 72 to 91 were used instead of the resist of Example 71, forming equivalent resist patterns.

Synthesis Example 6

Protection of poly(hydroxybenzylsilsesquioxane) with t-butoxycarbonyl (t-BOC)

In 250 g of pyridine was dissolved 25 g of poly(hydroxybenzylsilsesquioxane) of Synthesis Example 1(c). With stirring at 45° C., 5.14 g (0.0231 mol, corresponding to about 15 mol % based on OH group) of di-t-butyl dicarbonate was added. Gas evolved at the same time as addition and reaction was carried out in a nitrogen gas stream for 1½ hours. The reaction solution was stripped of the pyridine, dissolved in 100 ml of methanol, and added dropwise to 5 liters of water, yielding a white precipitate. The precipitate was washed 5 times with water, filtered, and dried in vacuum below 40° C., to give 25 g of t-butoxycarbonylated poly(hydroxybenzylsilsesquioxane). This is designated Synthesis Example 2(c). The product was analyzed by proton-NMR. From a peak of phenyl at 6 to 7 ppm and peaks of t-butyl and methylene at 1 to 2 ppm, the t-BOC introduction rate was calculated to be 14.6%.

Synthesis Example 7 t-butoxycarbonylmethylation of poly(hydroxybenzylsilsesquioxane)

In 250 g of pyridine was dissolved 25 g of poly(hydroxybenzylsilsesquioxane) of Synthesis Example 1(c). With stirring at 45° C., 6.67 g (0.034 mol) of t-butyl bromoacetate was added. Reaction was carried out in a nitrogen gas stream for 5 hours. The reaction solution was stripped of the pyridine, dissolved in 100 ml of methanol, and added dropwise to 5 liters of water, yielding a white precipitate. The precipitate was washed 5 times with water, filtered, and dried in vacuum below 40° C., to give 24 g of t-butoxycarbonylmethylated poly(hydroxybenzylsilsesquioxane). The product was analyzed by proton-NMR. From a peak of phenyl at 6 to 7 ppm and peaks of t-butyl and methylene at 1 to 2 ppm, the t-butoxycarbonylmethyl introduction rate was calculated to be 14.8%.

Synthesis Example 8

Trimethylsilylation of poly(hydroxybenzylsilsesquioxane)

In 40 ml of acetone was dissolved 25 g of poly(hydroxybenzylsilsesquioxane) of Synthesis Example 1(c). 3.9 g of trimethylamine was added thereto. With stirring at 45° C., 0.71 g of trimethylsilylchloride was added. The reaction solution was aged by refluxing for 2 hours. The reaction solution was stripped of the acetone, dissolved in 100 ml of methanol, and added dropwise to 5 liters of water, yielding a white precipitate. The precipitate was washed 5 times with water, filtered, and dried in vacuum below 40° C., to give 25 g of trimethylsilylated poly(hydroxybenzylsilsesquioxane). The product was analyzed by proton-NMR. From a peak of phenyl at 6 to 7 ppm and a peak of methyl of trimethylsilyl at about 0 ppm, the trimethylsilyl introduction rate was calculated to be 14.9%.

Synthesis Example 9

Protection of poly(hydroxybenzylsilsesquioxane) with tetrahydropyranyl

In 40 ml of acetone was dissolved 25 g of poly(hydroxybenzylsilsesquioxane) of Synthesis Example 1(c). 5.6 g of pyridinium tosylate was added thereto. With stirring at room temperature, 9.7 g of dihydropyrane was added over one hour. The reaction solution was aged at room temperature for 10 hours. The reaction solution was stripped of the acetone, dissolved in 100 ml of methanol, and added dropwise to 5 liters of water, yielding a white precipitate. The precipitate was washed 5 times with water, filtered, and dried in vacuum below 40° C., to give 20 g of tetrahydropyranyl-bearing poly(hydroxybenzylsilsesquioxane). The product was analyzed by proton-NMR. From a peak of phenyl at 6 to 7 ppm and a peak of hydrogen at the alpha-position of tetrahydropyranyl at 5.5 ppm, the tetrahydropyranyl introduction rate was calculated to be 14.2%.

The following examples illustrate synthesis of dissolution inhibitors.

Synthesis Example 10 t-butylation of 1,3-bis(hydroxycarbonylehy)-1,3-tetramethyldisiloxane

In 300 ml of acetone were dissolved 23.0 g (0.1 mol) of 1,3-bis(hydroxycarbonylethyl)-1,3-tetramethyldisiloxane and 50.4 g (0.24 mol) of trifluoroacetic acid anhydride. With stirring at room temperature, 59.2 g (0.8 mol) of t-butyl alcohol was slowly added thereto. The reaction solution was aged for 5 hours. The unreacted t-butyl alcohol and acetone solvent were stripped off. The residue was dissolved in toluene and washed three times with water. After separatory operation, the toluene was stripped off, obtaining 30 g of an oily product which was 1,3-bis(t-butoxycarbonylethyl)-1,3-tetramethyldisiloxane.

The reaction scheme is shown below.

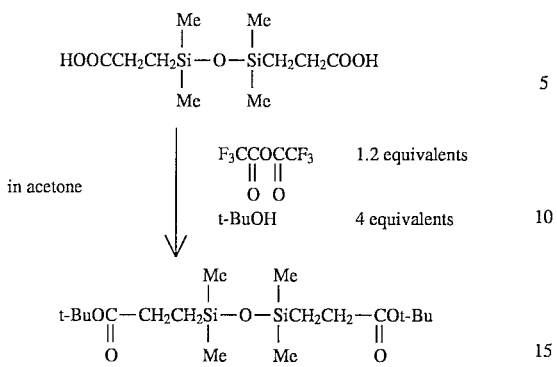

Synthesis Example 11 t-butylation of linear poly(hydroxycarbonylethyl)siloxane

In 300 ml of acetone were dissolved 20.0 g of poly(hydroxycarbonylethyl)methylsiloxane having an average degree of polymerization of 6 and 50.4 g (0.24 mol) of trifluoroacetic acid anhydride. With stirring at room temperature, 59.2 g (0.8 mol) of t-butyl alcohol was slowly added thereto. The reaction solution was aged for 5 hours. The unreacted t-butyl alcohol and acetone solvent were stripped off. The residue was dissolved in toluene and washed three times with water. After separatory operation, the toluene was stripped off, obtaining 29.8 g of an oily product which was poly(t-butoxycarbonylethyl)methylsiloxane.

The reaction scheme is shown below.

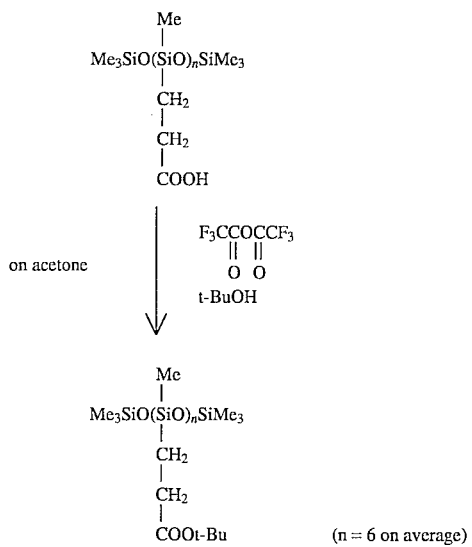

Synthesis Example 12 t-butylation of cyclic poly(hydroxycarbonylethyl)siloxane

In 300 ml of acetone were dissolved 40.0 g (0.1 mol) of cyclo-1,3,5,7-tetrakis(hydroxycarbonylethyl)-1,3,5,7-tetramethyltetrasiloxane and 50.4 g (0.24 mol) of trifluoroacetic acid anhydride. With stirring at room temperature, 59.2 g (0.8 mol) of t-butyl alcohol was slowly added thereto. The reaction solution was aged for 5 hours. The unreacted t-butyl alcohol and acetone solvent were stripped off. The residue was dissolved in toluene and washed three times with water.

After separatory operation, the toluene was stripped off, and the residue was dissolved in 50 ml of methanol and then added to 1 liter of water, yielding a colorless precipitate. The precipitate was filtered and dried, obtaining 83.0 g of cyclo-1,3,5,7-tetrakis(butoxy-carbonylethyl)-1,3,5,7-tetramethyltetrasiloxane.

The reaction scheme is shown below.

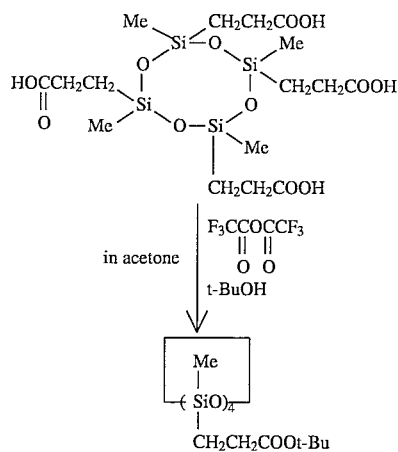

Synthesis Example 13 t-butoxycarbonylmethylation of 1,3-bis(hydroxycarbonylethyl)-1,3-tetramethyldisiloxane In 300 ml of acetone were dissolved 23.0 g (0.1 mol) of 1,3-bis(hydroxycarbonylethyl)-1,3-tetramethyldisiloxane and 19.0 g (0.24 mol) of pyridine. With stirring under reflux, 46.8 g (0.24 mol) of t-butyl bromoacetate was slowly added thereto. The reaction solution was aged for 10 hours. The acetone solvent was stripped off. The residue was dissolved in toluene and washed three times with water. After separatory operation, the toluene was stripped off, obtaining 54.0 g of an oily product which was 1,3-bis(t-butoxycarbonylmethoxycarbonylethyl)-1,3-tetramethyldisiloxane.

The reaction scheme is shown below.

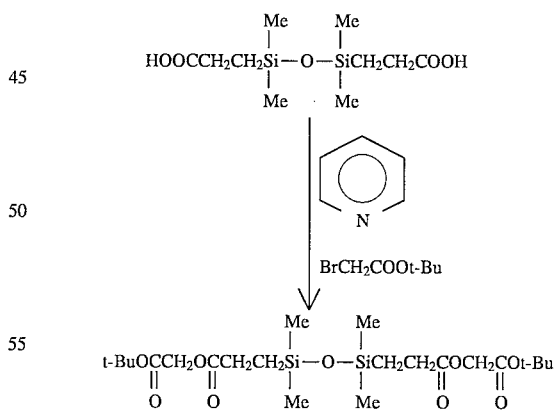

Synthesis Example 14 t-butoxycarbonylmethylation of linear poly(hydroxycarbonylethyl)siloxane

In 300 ml of acetone were dissolved 20.0 g of poly(hydroxycarbonylethyl)methylsiloxane having an average degree of polymerization of 6 and 19.0 g (0.24 mol) of pyridine. With stirring under reflux, 46.8 g (0.24 mol) of t-butyl bromoacetate was slowly added thereto. The reaction solution was aged for 10 hours. The acetone solvent was stripped off. The residue was dissolved in toluene and washed three times with water. After separatory operation, the toluene was stripped off and the residue was dried in vacuum, obtaining 52.0 g of an oily product which was poly(t-butoxycarbonylmethoxycarbonylethyl)methylsiloxane.

The reaction scheme is shown below.

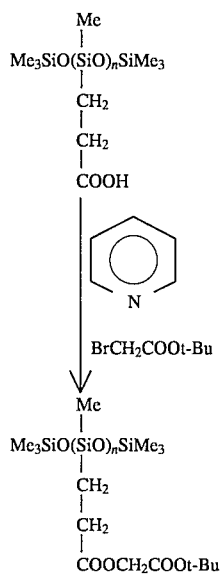

Synthesis Example 15 t-butoxycarbonylmethylation of cyclic poly(hydroxycarbonylethyl)siloxane

In 300 ml of acetone were dissolved 40.0 g (0.1 mol) of cyclo-1,3,5,7-tetrakis(hydroxycarbonylethyl)-1,3,5,7-tetramethyltetrasiloxane and 19.0 g (0.24 mol) of pyridine. With stirring under reflux, 46.8 g (0.24 mol) of t-butyl bromoacetate was slowly added thereto. The reaction solution was aged for 10 hours. The acetone solvent was stripped off. The residue was dissolved in toluene and washed three times with water. After separatory operation, the toluene was stripped off, and the residue was dissolved in 50 ml of methanol and then added to 1 liter of water, yielding a colorless precipitate. The precipitate was filtered and dried, obtaining 89.2 g of cyclo-1,3,5,7-tetrakis(butoxycarbonylmethyloxycarbonylethyl)-1,3,5,7-tetramethyltetrasiloxane.

The reaction scheme is shown below.

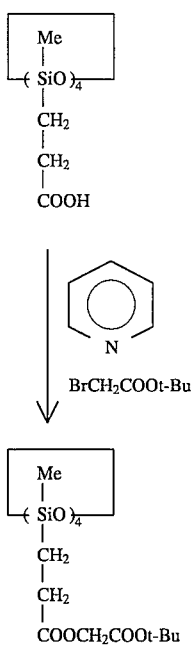

Synthesis Example 16

Hydrosilylation of 1,3-dihydro-1,3-tetramethyldisiloxane and p-t-butoxystyrene

To a mixture of 13.4 g (0.1 mol) of 1,3-dihydro-1,3-tetramethyldisiloxane, 0.10 g of triethylamine, and 0.2 g of an isopropanol solution of 2% chloroplatinic acid, 21.1 g (0.12 mol) of p-t-butoxystyrene was slowly added, with stirring at a reaction temperature of 60° C. The reaction product was aged for 10 hours, dissolved in toluene and washed three times with water. After separatory operation, the toluene was stripped off and the residue was dried in vacuum, obtaining 33.2 g of an oily product which was 1,3-bis(p-t-butoxyphenylethyl)-1,3-tetramethyldisiloxane.

The reaction scheme is shown below.

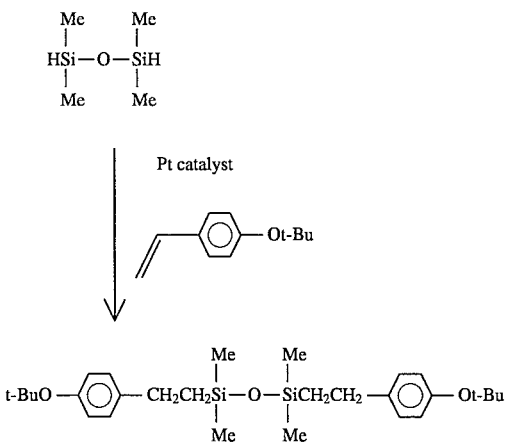

Synthesis Example 17

Hydrosilylation of linear polyhydroxymethylsiloxane and p-t-butoxystyrene

To a mixture of 20.0 g of poly(hydroxycarbonylethyl)methylsiloxane having an average degree of polymerization of 6, 0.10 g of triethylamine, and 0.2 g of an isopropanol solution of 2% chloroplatinic acid, 21.1 g (0.12 mol) of p-t-butoxystyrene was slowly added, with stirring at a reaction temperature of 60° C. The reaction product was aged for 10 hours, dissolved in toluene and washed three times with water. After separatory operation, the toluene was stripped off and the residue was dried in vacuum, obtaining 35.1 g of an oily product which was poly(p-t-butoxyphenylethyl)methylsiloxane.

The reaction scheme is shown below.

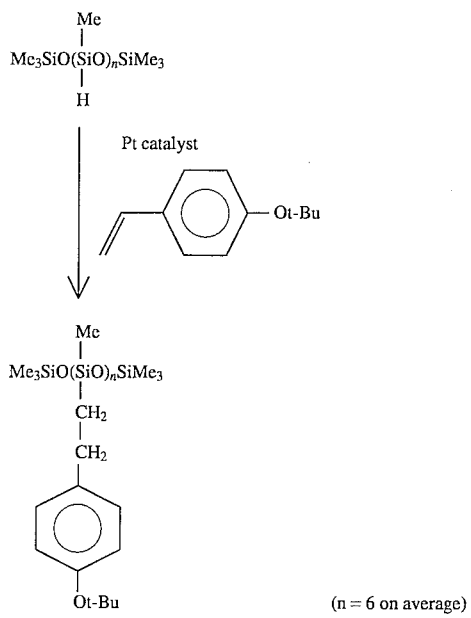

Synthesis Example 18

Hydrosilylation of cyclic poly-(hydroxycarbonylethyl)siloxane and p-t-butoxystyrene In 50 ml of toluene were dissolved 24.0 g (0.1 mol) of cyclo-1,3,5,7-tetrahydro-1,3,5,7-tetramethyltetrasiloxane, 40.0 g (0.1 mol) of cyclo-1,3,5,7-tetrakis(hydroxycarbonylethyl)-1,3,5,7-tetramethyltetrasiloxane, 0.10 g of triethylamine, and 0.2 g of an isopropanol solution of 2% chloroplatinic acid. With stirring under reflux, 21.1 g (0.12 mol) of p-t-butoxystyrene was slowly added thereto. The reaction product was aged for 10 hours and washed three times with water. After separatory operation, the toluene was stripped off. The residue was dissolved in 20 ml of acetone and added to water, yielding a precipitate. The precipitate was filtered and dried, obtaining 49.8 g of cyclo-1,3,5,7-tetrakis (p-t-butoxyphenylethyl) -1,3,5,7-tetramethyltetrasiloxane.

The reaction scheme is shown below.

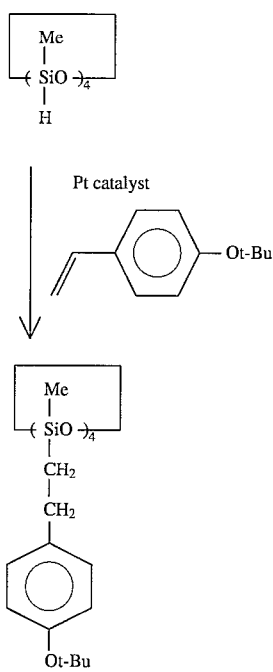

In the following Examples, especially in Table, the polymers of Synthesis Examples 6 to 9 are simply referred to by their acronyms SE 6 to SE 9, respectively, and the dissolution inhibitors of Synthesis Examples 10 to 19 are simply referred to by their acronyms SE 10 to SE 19, respectively.

Example 113

A resist solution was prepared from the following ingredients.

|  | pbw |
| --- | --- |
| Base resin (Synthesis Example 6) | 80 |
| Tri(p-t-butoxyphenyl)trifluoromethane sulfonate | 4 |
| Dissolution inhibitor of Synthesis Example 10 | 16 |
| 1-ethoxy-2-propanol | 600 |

It was spin coated onto a silicon substrate at 2,000 rpm and pre-baked on a hot plate at 85° C. for one minute, obtaining a film of 0.4 μm thick. The resist film was exposed imagewise to KrF excimer laser or an electron beam at an accelerating voltage of 30 kV, baked (PEB) at 85° C. for 2 minutes, and developed with an aqueous solution of 2.4% tetramethylammonium hydroxide (TMAH) for one minute, and rinsed with water for 30 seconds.

The resist material was positive working and had a $D_0$ sensitivity of 3.8 μC/cm$^2$ and an Eth sensitivity of 5.7 mJ/cm as evaluated using KrF excimer laser (wavelength 248 nm) as deep-UV radiation instead of the electron beam. The base resin used herein had a dissolution rate of 34 nm/s in the developer. The resist material had a dissolution rate of about 1.0 nm/s in unexposed areas and a dissolution rate of 39 nm/s in exposed areas after PEB.

Upon imagewise exposure with the KrF excimer laser, a 0.24 μm line-and-space pattern and a hole pattern could be resolved and a pattern having a side wall perpendicular to the substrate was formed. Upon imagewise exposure with the electron beam, a resolution to 0.1 μm was possible.

Examples 114–127

Resist solutions were prepared as in Example 113 except that the base resin and photo acid generator shown in Table 5 were used. They were similarly coated on silicon wafer substrates and exposed to KrF excimer laser. The Eth sensitivity and resolution or line-and-space width are reported in Table 5.

TABLE 5

| Example No. | Base resin | Dissolution inhibitor | Eth (mJ/cm$^2$) | Resolution (μm) |
|---|---|---|---|---|
| 113 | SE 6 | SE 10 | 5.7 | 0.24 |
| 114 | SE 6 | SE 13 | 6.0 | 0.24 |
| 115 | SE 7 | SE 10 | 7.0 | 0.24 |
| 116 | SE 7 | SE 11 | 7.0 | 0.24 |
| 117 | SE 7 | SE 12 | 7.0 | 0.24 |
| 118 | SE 7 | SE 13 | 7.5 | 0.24 |
| 119 | SE 8 | SE 10 | 5.5 | 0.24 |
| 120 | SE 8 | SE 12 | 6.0 | 0.24 |
| 121 | SE 8 | SE 13 | 6.2 | 0.24 |
| 122 | SE 8 | SE 14 | 6.5 | 0.24 |
| 123 | SE 8 | SE 15 | 6.5 | 0.24 |
| 124 | SE 8 | SE 16 | 6.0 | 0.26 |
| 125 | SE 8 | SE 17 | 5.0 | 0.26 |
| 126 | SE 8 | SE 18 | 5.0 | 0.26 |
| 127 | SE 9 | SE 10 | 11.0 | 0.28 |

Example 128

A resist solution of the same composition as in Example 113 was prepared. A silicon wafer was coated with a lower resist film of 2 μm thick using OFPR 800 (Tokyo Oka K.K.), and the film was cured by heating at 200° C. for one hour. As in Example 113, the resist solution was coated onto the lower resist film to a thickness of about 0.4 μm and prebaked. As in Example 113, the resist film was exposed to an electron beam or KrF excimer laser and developed, forming a pattern on the lower resist film. Using a parallel plate type sputter etching apparatus, the resist was etched with oxygen gas as an etchant gas. The etching conditions are shown below.

Gas flow rate: 50 SCCM
Gas pressure: 1.3 Pa
RF power: 50 watts
DC bias: 450 volts The lower resist film was etched at a rate of 150 nm/min. while the upper resist film of the composition of Example 113 was etched at a rate of less than 3 nm/min. After 15 minutes of etching, those portions of the lower resist film which were not covered with the upper resist film were completely eliminated, leaving a two-layer resist pattern having a thickness of more than 2 μm.

Examples 129–142

Two-layer resists were prepared and etched as in Example 128 except that the resist materials of Examples 114 to 127 were used instead of the resist of Example 113, forming equivalent resist patterns.

Japanese Patent Application Nos. 331720/1994, 331721/1994 and 331722/1994 are incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A positive resist composition comprising a silicone polymer of the general formula (1):

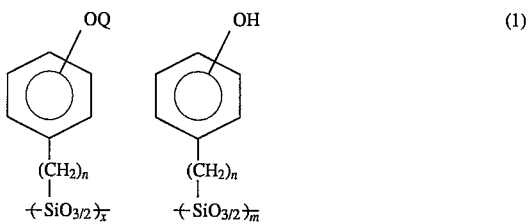

wherein Q is selected from the group consisting of t-butoxycarbonyl, t-butoxycarbonylmethyl, trimethylsilyl and tetrahydropyranyl groups, letter n is an integer of 1 to 3, x and m are numbers satisfying x+m=1, and x is not equal to 0, and a photo acid generator which will decompose to generate an acid upon exposure to radiation, said photo acid generator being an onium salt of the general formula (2):

$$(R)_p JM \qquad (2)$$

wherein R is a substituted or unsubstituted aromatic group, at least one of the R groups is a phenyl group having a t-alkoxy substituent represented by R'$_3$CO— wherein R' is a substituted or unsubstituted monovalent hydrocarbon group having 1 to 10 carbon atoms, a t-butoxycarbonyloxy substituent or a t-butoxycarbonylmethoxy substituent, J is sulfonium or iodonium, M is a p-toluenesulfonate or trifluoromethanesulfonate group, and letter p is equal to 2 or 3, said resist composition being developable with alkaline aqueous solution.

2. The resist composition of claim 1 further comprising a dissolution inhibitor.

3. The composition of claim 2, wherein the composition contains up to 40% by weight of the dissolution inhibitor.

4. The composition of claim 1, wherein x is from 0.05 to 0.5.

5. The composition of claim 1, wherein the silicone polymer of general formula (1) has a weight average molecular weight of 5,000 to 50,000.

6. The composition of claim 1, wherein Q is tert-butoxycarbonylmethyl.

7. The composition of claim 1, wherein the composition contains at least 55% by weight of the silicone polymer of formula (1).

8. The composition of claim 1, wherein the onium salt of the general formula (2) is selected from the group consisting of the following formulae:

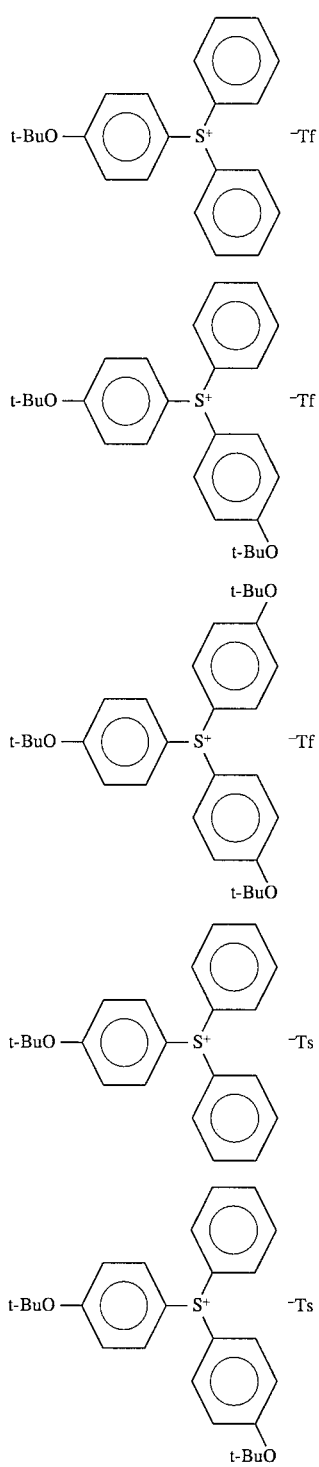
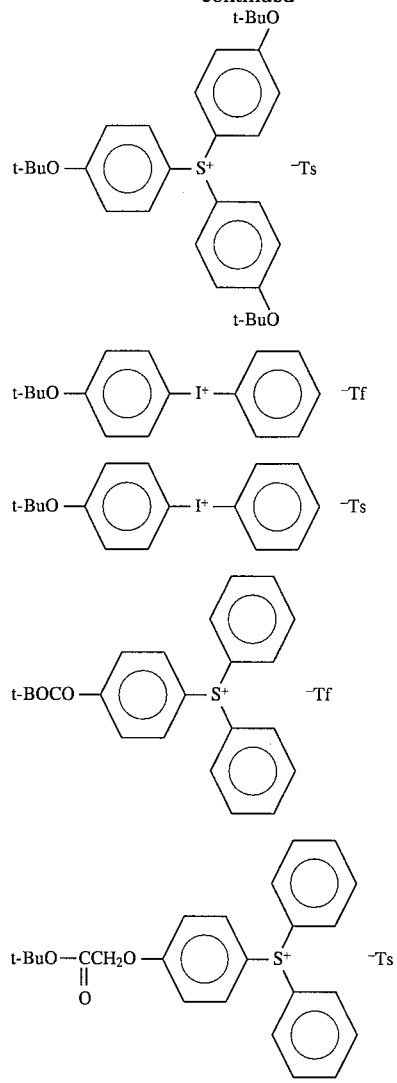
where Tf stands for trifluoromethanesulfonate, Ts for p-toluenesulfonate and t-BOC for a t-butoxycarbonyl group.
9. The composition of claim 1, wherein the composition contains 0.5 to 15% by weight of the onium salt of formula (2).
10. A positive resist composition comprising a silicone polymer of the general formula (1):
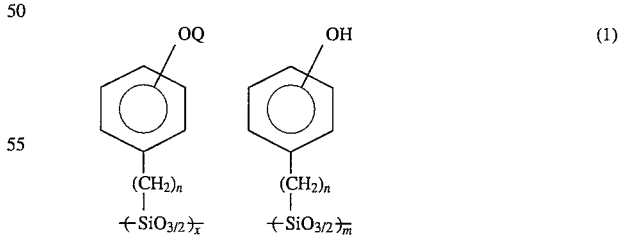

wherein Q is selected from the group consisting of t-butoxycarbonyl, t-butoxycarbonylmethyl, trimethylsilyl and tetrahydropyranyl groups, letter n is an integer of 1 to 3, x and m are numbers satisfying x+m=1, and x is not equal to 0, a photo acid generator which will decompose to generate an acid upon exposure to radiation, and a nitrogenous compound, said resist composition being developable with alkaline aqueous solution.

11. The resist composition of claim 10 further comprising a dissolution inhibitor.

12. The composition of claim 11, wherein the composition contains up to 40% by weight of the dissolution inhibitor.

13. The composition of claim 10, wherein the nitrogenous compound is N-methylaniline, toluidine, N-methylpyrrolidone, aminobenzoic acid, phenylenediamine or diphenylamine.

14. The composition of claim 10, wherein the composition contains the nitrogenous compound in an amount of 0.01 to 1% by weight.

15. The composition of claim 10, wherein the composition contains at least 55% by weight of the silicone polymer of formula (1).

16. The composition of claim 10, wherein the composition contains 0.5 to 15% by weight of the photo acid generator.

17. A positive resist composition comprising a silicone polymer of the general formula (1):

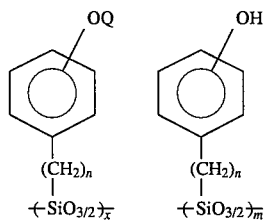  (1)

wherein Q is selected from the group consisting of t-butoxycarbonyl, t-butoxycarbonylmethyl, trimethylsilyl and tetrahydropyranyl groups, letter n is an integer of 1 to 3, x and m are numbers satisfying x+m=1, and x is not equal to 0, a photo acid generator which will decompose to generate an acid upon exposure to radiation, and a dissolution inhibitor which is a silicone compound of the following general formula (3), (4) or (5):

  (3)

  (4)

  (5)

wherein $R^1$ is a methyl or phenyl group, $R^2$ is a carboxyethyl or p-hydroxyphenylalkyl group where the carboxy or hydroxy group is protected with a t-butyl or t-butylcarbonylmethyl group, X is a trimethylsilyl, triphenylsilyl or —$SiR^1_2R^2$ wherein $R^1$ and $R^2$ are as defined above, letter a is an integer of 0 to 50, b is an integer of 1 to 50, and c is an integer of 3 to 10, said resist composition being developable with alkaline aqueous solution.

18. The composition of claim 17, further comprising a nitrogenous compound.

19. The composition of claim 17, wherein the dissolution inhibitor of the one of the formulae (3), (4) or (5) is selected from the group consisting of:

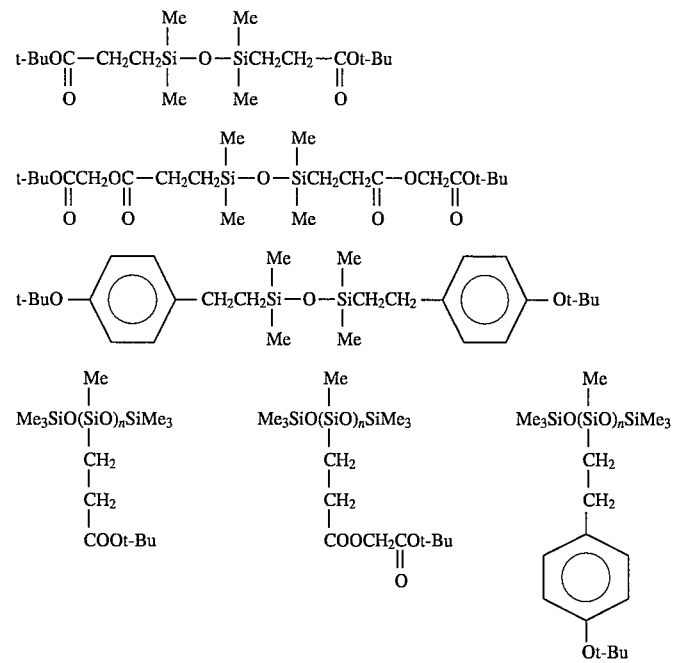

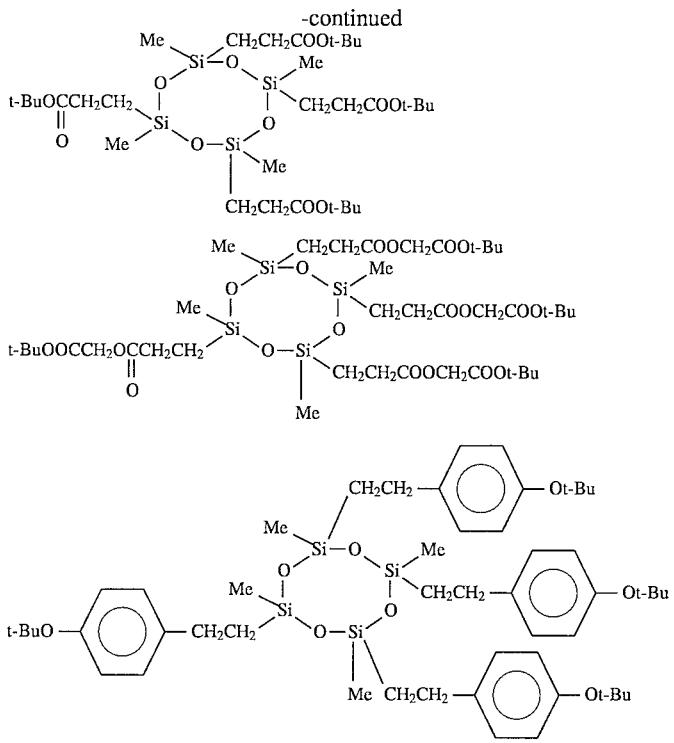

where t-Bu is a tert-butyl group and n=1–50.

20. The composition of claim 17, wherein the composition contains up to 40% by weight of the dissolution inhibitor.

21. The composition of claim 17, wherein the composition contains 10 to 30% by weight of the dissolution inhibitor.

22. The composition of claim 17, wherein the composition contains at least 55% by weight of the silicone polymer of formula (1).

23. The composition of claim 17, wherein the composition contains 0.5 to 15% by weight of the photo acid generator.

* * * * *